United States Patent
Yamamoto et al.

(10) Patent No.: US 11,945,049 B2
(45) Date of Patent: Apr. 2, 2024

(54) SiC WAFER MANUFACTURING METHOD AND SiC WAFER MANUFACTURING APPARATUS

(71) Applicant: DISCO CORPORATION, Tokyo (JP)

(72) Inventors: Ryohei Yamamoto, Tokyo (JP); Shuichi Torii, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 265 days.

(21) Appl. No.: 16/891,212

(22) Filed: Jun. 3, 2020

(65) Prior Publication Data
US 2020/0391327 A1 Dec. 17, 2020

(30) Foreign Application Priority Data

Jun. 14, 2019 (JP) .................. 2019-111302

(51) Int. Cl.
*B23K 26/38* (2014.01)
*B23K 103/00* (2006.01)
*B28D 5/00* (2006.01)
*G01N 21/95* (2006.01)
*H01L 29/16* (2006.01)

(52) U.S. Cl.
CPC ............ *B23K 26/38* (2013.01); *B28D 5/0011* (2013.01); *G01N 21/9505* (2013.01); *B23K 2103/50* (2018.08); *H01L 29/1608* (2013.01)

(58) Field of Classification Search
CPC .... B23K 2103/50; B23K 26/38; B23K 26/53; B28D 5/0011; B28D 5/00; G01N 21/9505; G01N 21/95; H01L 29/045; H01L 29/1608
See application file for complete search history.

(56) References Cited

U.S. PATENT DOCUMENTS

| 7,592,237 | B2* | 9/2009 | Sakamoto | B23K 26/53 438/114 |
| 8,685,838 | B2* | 4/2014 | Fukuyo | B23K 26/60 438/460 |
| 8,872,067 | B2* | 10/2014 | Fukumitsu | B23K 26/0732 372/24 |
| 10,573,505 | B2* | 2/2020 | Hirata | C30B 29/36 |
| 11,004,802 | B1* | 5/2021 | Spry | H01L 24/05 |

(Continued)

FOREIGN PATENT DOCUMENTS

| JP | 2000094221 A | 4/2000 |
| JP | 2016111143 A | 6/2016 |

*Primary Examiner* — Dana Ross
*Assistant Examiner* — Adam M Eckardt
(74) *Attorney, Agent, or Firm* — Greer, Burns & Crain, Ltd.

(57) ABSTRACT

A method for manufacturing an SiC wafer from an SiC ingot includes a verifying step of applying a test laser beam to the SiC ingot in a predetermined area with the focal point of the test laser beam set inside the SiC ingot at a predetermined depth from the end surface of the SiC ingot. The test laser beam has a transmission wavelength to SiC, thereby forming a test separation layer inside the SiC ingot at the predetermined depth. The test separation layer has a test modified portion where SiC is decomposed into Si and C and test cracks extend from the test modified portion along a c-plane in the SiC ingot. Whether or not the test cracks have been properly formed is verified. When verifying, the power of the test laser beam is changed to set a proper power at which the test cracks are properly formed.

12 Claims, 7 Drawing Sheets

(56) References Cited

U.S. PATENT DOCUMENTS

| | | | |
|---|---|---|---|
| 2005/0170616 A1* | 8/2005 | Murata | H01L 21/3043 257/E21.599 |
| 2007/0111481 A1* | 5/2007 | Tamura | B28D 5/0011 257/797 |
| 2013/0026145 A1* | 1/2013 | Ide | B23K 26/53 219/121.72 |
| 2015/0038313 A1* | 2/2015 | Hosseini | B23K 26/0648 219/121.75 |
| 2015/0140735 A1* | 5/2015 | Hosseini | B23K 26/356 438/107 |
| 2016/0158880 A1* | 6/2016 | Koitzsch | H01L 21/78 264/400 |
| 2016/0354863 A1* | 12/2016 | Hirata | B23K 26/53 |
| 2017/0053831 A1* | 2/2017 | Hirata | H01L 21/304 |
| 2017/0291254 A1* | 10/2017 | Hirata | B28D 5/0011 |
| 2017/0326688 A1* | 11/2017 | Turner | B23K 26/122 |
| 2018/0218896 A1* | 8/2018 | Hirata | H01L 21/02013 |
| 2018/0254223 A1* | 9/2018 | Hirata | B23K 26/53 |
| 2018/0308679 A1* | 10/2018 | Hirata | B23K 26/3576 |
| 2019/0051561 A1* | 2/2019 | Hattori | B23K 26/08 |
| 2019/0126393 A1* | 5/2019 | Igasaki | B23K 26/064 |
| 2019/0178808 A1* | 6/2019 | Muhr | G01N 21/9503 |
| 2019/0304800 A1* | 10/2019 | Yamamoto | B23K 26/38 |
| 2019/0314934 A1* | 10/2019 | Sercel | B23K 26/082 |
| 2019/0362972 A1* | 11/2019 | Schulze | H01L 21/78 |
| 2019/0363020 A1* | 11/2019 | Seddon | B28D 5/047 |
| 2019/0382300 A1* | 12/2019 | Bui | B23K 26/0652 |
| 2020/0075415 A1* | 3/2020 | Sekiya | H01L 21/304 |
| 2020/0086426 A1* | 3/2020 | Yamamoto | B24B 1/00 |
| 2020/0156190 A1* | 5/2020 | Yamamoto | B23K 26/53 |
| 2020/0164469 A1* | 5/2020 | Bassett | B23K 26/0622 |
| 2020/0168451 A1* | 5/2020 | Lu | H01L 21/02024 |
| 2020/0215648 A1* | 7/2020 | Swoboda | B23K 26/146 |
| 2020/0361037 A1* | 11/2020 | Ivanov | B23K 26/53 |
| 2020/0376603 A1* | 12/2020 | Ortner | B23K 26/359 |
| 2020/0388538 A1* | 12/2020 | Swoboda | B28D 5/0011 |
| 2020/0391327 A1* | 12/2020 | Yamamoto | G01N 21/9505 |
| 2021/0276121 A1* | 9/2021 | Shimanuki | B23K 26/03 |
| 2022/0009038 A1* | 1/2022 | Sakamoto | B23K 26/53 |
| 2022/0044935 A1* | 2/2022 | Mori | B23K 26/53 |
| 2022/0111469 A1* | 4/2022 | Myles | B23K 26/53 |

\* cited by examiner

SiC WAFER MANUFACTURING METHOD AND SiC WAFER MANUFACTURING APPARATUS

BACKGROUND OF THE INVENTION

Field of the Invention

The present invention relates to an SiC wafer manufacturing method for manufacturing an SiC wafer from an SiC ingot and also to an SiC wafer manufacturing apparatus for performing the SiC wafer manufacturing method.

Description of the Related Art

Various devices such as integrated circuits (ICs), large-scale integrations (LSIs), and light emitting diodes (LEDs) are formed by forming a functional layer on the front side of a wafer formed of Si (silicon) or $Al_2O_3$ (sapphire) and partitioning this functional layer into a plurality of separate regions along a plurality of division lines. Further, power devices or optical devices such as LEDs are formed by forming a functional layer on the front side of an SiC wafer formed of single-crystal SiC (silicon carbide) and partitioning this functional layer into a plurality of separate regions along a plurality of division lines. The division lines of such a wafer having these devices are processed by a processing apparatus such as a cutting apparatus and a laser processing apparatus to thereby divide the wafer into a plurality of individual device chips each including each of the devices. The device chips thus obtained are used in various electrical equipment such as mobile phones and personal computers.

In general, the wafer on which the devices are to be formed is manufactured by slicing a cylindrical ingot with a wire saw. Both sides of the wafer sliced from the ingot are polished to a mirror finish (see Japanese Patent Laid-open No. 2000-94221, for example). However, when the ingot is sliced by the wire saw and both sides of each SiC wafer sliced from the ingot are polished to obtain the product, a large proportion (70% to 80%) of the ingot is discarded to cause a problem of poor economy. In particular, an SiC ingot has high hardness, and it is therefore difficult to slice the SiC ingot with the wire saw. Accordingly, considerable time is required for slicing of the SiC ingot, causing a reduction in productivity. Furthermore, since an SiC ingot is high in unit price, there is a problem in efficiently manufacturing an SiC wafer from an SiC ingot in this related art.

The present applicant has proposed a technique for solving these problems (see Japanese Patent Laid-open No. 2016-111143, for example). This technique includes the steps of setting the focal point of a laser beam having a transmission wavelength to single-crystal SiC inside an SiC ingot, next applying the laser beam to the SiC ingot as scanning the laser beam on the SiC ingot to thereby form a separation layer in a cutting plane previously set inside the SiC ingot, and next breaking the SiC ingot along the cutting plane where the separation layer having a reduced strength has been formed, thus separating an SiC wafer from the SiC ingot.

SUMMARY OF THE INVENTION

However, there is a problem such that when the height of the SiC ingot is decreased by the repetition of the separation of the SiC wafer, causing a change in crystal structure in the cutting plane, it is difficult to properly form the separation layer along the cutting plane under the initial processing conditions. Further, since the crystal structure in the SiC ingot varies from one ingot to another, there is a case that the processing conditions for properly forming the separation layer for initially separating the SiC wafer from the SiC ingot may vary from one ingot to another. Accordingly, when the SiC ingot to be processed is changed, there is a case that the separation layer cannot be properly formed along the cutting plane under the previous processing conditions.

It is therefore an object of the present invention to provide an SiC wafer manufacturing method which can properly form the separation layer along the cutting plane even when the height of the SiC ingot is decreased by the repetition of the separation of the SiC wafer, causing a change in crystal structure in the cutting plane or even when the SiC ingot to be processed is changed to cause a change in crystal structure in the cutting plane. It is another object of the present invention to provide an SiC wafer manufacturing apparatus for performing the SiC wafer manufacturing method mentioned above.

In accordance with an aspect of the present invention, there is provided an SiC wafer manufacturing method for manufacturing an SiC wafer from an SiC ingot having an end surface, the SiC wafer manufacturing method including: a verifying step of applying a test laser beam to the SiC ingot in a predetermined area in the condition where the focal point of the test laser beam is set inside the SiC ingot at a predetermined depth from the end surface of the SiC ingot, the predetermined depth corresponding to the thickness of the SiC wafer to be manufactured, the test laser beam having a transmission wavelength to SiC, thereby forming a test separation layer inside the SiC ingot at the predetermined depth, the test separation layer having a test modified portion where SiC is decomposed into Si and C and test cracks extending from the test modified portion along a c-plane in the SiC ingot, in which whether or not the test cracks have been properly formed is verified; a separation layer forming step of applying a laser beam to the SiC ingot in the condition where the focal point of the laser beam is set inside the SiC ingot at the predetermined depth from the end surface of the SiC ingot after performing the verifying step, the predetermined depth corresponding to the thickness of the SiC wafer to be manufactured, the laser beam having a transmission wavelength to SiC, thereby forming a separation layer inside the SiC ingot at the predetermined depth, the separation layer having a modified portion where SiC is decomposed into Si and C and cracks extending from the modified portion along the c-plane in the SiC ingot; and a separating step of separating the SiC wafer from the SiC ingot along the separation layer after performing the separation layer forming step, the verifying step including the steps of changing the power of the test laser beam and setting the power of the test laser beam to a power at which the test cracks are properly formed.

Preferably, the verifying step is performed again after initially performing the separating step and before next performing the separating step.

In accordance with another aspect of the present invention, there is provided an SiC wafer manufacturing apparatus for manufacturing an SiC wafer from an SiC ingot having an end surface, the SiC wafer manufacturing apparatus including: a laser beam applying unit for applying a laser beam to the SiC ingot in the condition where the focal point of the laser beam is set inside the SiC ingot at a predetermined depth from the end surface of the SiC ingot, the predetermined depth corresponding to the thickness of the SiC wafer to be manufactured, the laser beam having a transmission wavelength to SiC, thereby forming a separation layer inside the SiC ingot at the predetermined depth, the separation layer having a modified portion where SiC is decomposed into Si and C and cracks extending from the modified portion along a c-plane in the SiC ingot; a separating unit for separating the SiC wafer from the SiC ingot along the separation layer; and a verifying unit for applying a test laser beam to the SiC ingot in a predetermined area in the condition where the focal point of the test laser beam is set inside the SiC ingot at the predetermined depth from the end surface of the SiC ingot, the predetermined depth corresponding to the thickness of the SiC wafer to be manufactured, the test laser beam having a transmission wavelength to SiC, thereby forming a test separation layer inside the SiC ingot at the predetermined depth, the test separation layer having a test modified portion where SiC is decomposed into Si and C and test cracks extending from the test modified portion along the c-plane in the SiC ingot, in which whether or not the test cracks have been properly formed is verified, in which the verifying unit performs verification by changing the power of the test laser beam and setting the power of the test laser beam to a power at which the test cracks are properly formed.

Preferably, the verifying unit includes a light emitting member for applying light to the test separation layer formed in the SiC ingot, a camera for imaging the test separation layer, and a determining portion for determining whether or not the power of the test laser beam is a power at which the test cracks of the test separation layer are properly formed, according to whether or not the brightness of an image obtained by the camera falls within a threshold range. Preferably, the determining portion performs binarization processing for the image to obtain a binary image and then determines whether or not the ratio between a black area and a white area in the binary image falls within a predetermined range, in which, when the ratio between the black area and the white area falls within the predetermined range, the determining portion determines that the power of the test laser beam is a power at which the test cracks are properly formed.

According to the SiC wafer manufacturing method of the present invention, the following effect can be exhibited. Even when the height of the SiC ingot is decreased by the repetition of the separation of the SiC wafer, causing a change in crystal structure in the cutting plane or even when the SiC ingot to be processed is changed to cause a change in crystal structure in the cutting plane, the separation layer can be properly formed along the cutting plane.

According to the SiC wafer manufacturing apparatus of the present invention, the verifying unit is provided to set the power of the laser beam to a power at which the test cracks are properly formed in the separation layer after verifying the result of changing of the power of the laser beam. Accordingly, even when the height of the SiC ingot is decreased by the repetition of the separation of the SiC wafer, causing a change in crystal structure in the cutting plane or even when the SiC ingot to be processed is changed to cause a change in crystal structure in the cutting plane, the separation layer can be properly formed along the cutting plane.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
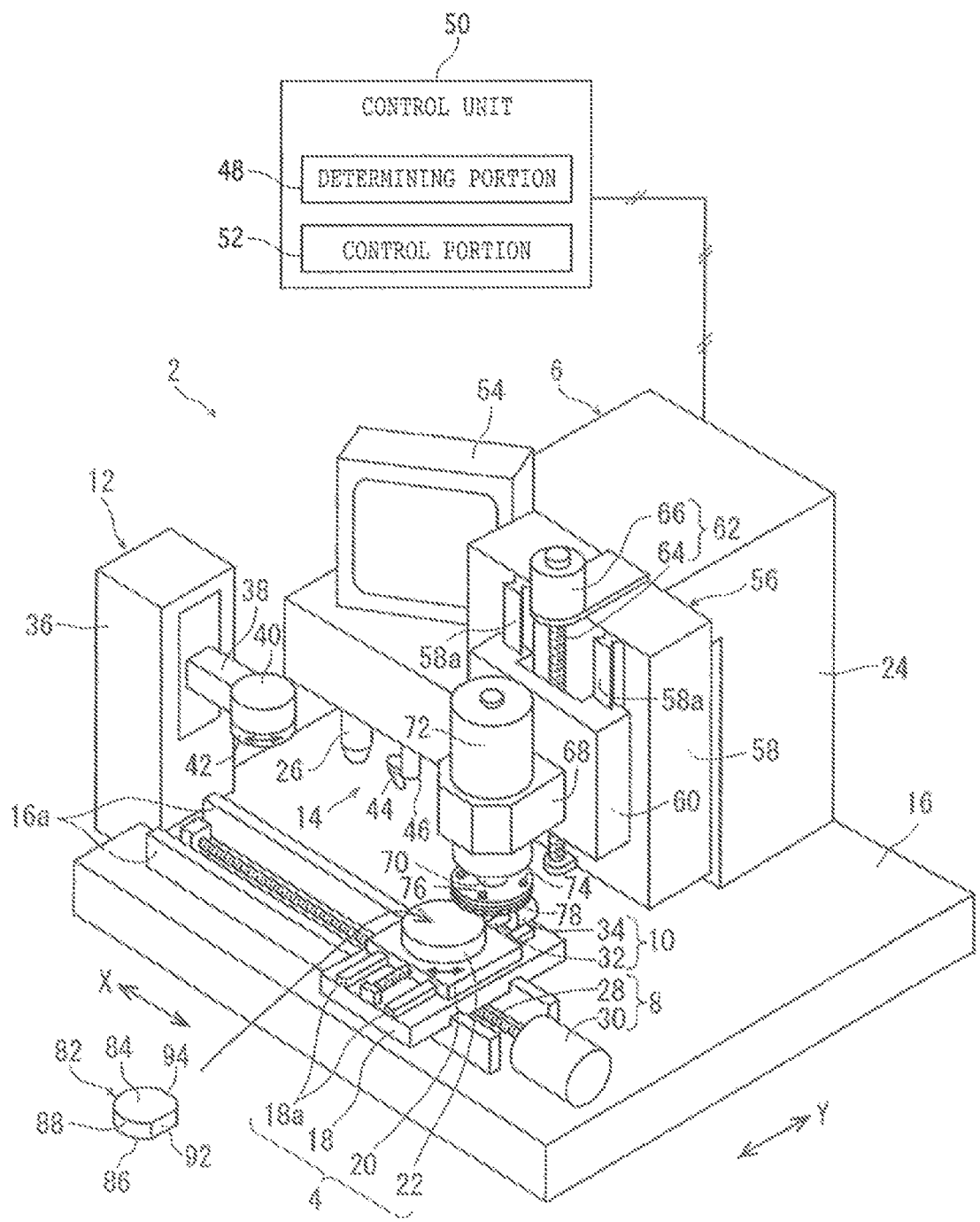
FIG. 1 is a perspective view of an SiC wafer manufacturing apparatus according to a preferred embodiment of the present invention.

A preferred embodiment of the SiC wafer manufacturing method and the SiC wafer manufacturing apparatus according to the present invention will now be described with reference to the drawings. The SiC wafer manufacturing apparatus according to this preferred embodiment will first be described with reference to FIG. 1. Referring to FIG. 1, there is depicted an SiC wafer manufacturing apparatus 2 including a holding unit 4, a laser beam applying unit 6, an X moving mechanism 8, a Y moving mechanism 10, a separating unit 12, and a verifying unit 14. The holding unit 4 functions to hold an SiC ingot. The laser beam applying unit 6 functions to apply a laser beam to the SiC ingot in the condition where the focal point of the laser beam is set inside the SiC ingot at a predetermined depth from an end surface of the SiC ingot, the predetermined depth corresponding to the thickness of an SiC wafer to be manufactured, the laser beam having a transmission wavelength to SiC, thereby forming a separation layer inside the SiC ingot at the predetermined depth, the separation layer having a modified portion where SiC is decomposed into Si (silicon) and C (carbon) and cracks extending from the modified portion along a c-plane in the SiC ingot. The X moving mechanism 8 functions to relatively move the holding unit 4 and the laser beam applying unit 6 in the X direction (feeding direction) depicted by an arrow X in FIG. 1. The Y moving mechanism 10 functions to relatively move the holding unit 4 and the laser beam applying unit 6 in the Y direction (indexing direction) depicted by an arrow Y in FIG. 1. The separating unit 12 functions to separate the SiC wafer from the SiC ingot along the separation layer. The verifying unit 14 functions to apply a test laser beam to the SiC ingot in a predetermined area in the condition where the focal point of the test laser beam is set inside the SiC ingot at the predetermined depth from the end surface of the SiC ingot, this predetermined depth corresponding to the thickness of the SiC wafer to be manufactured, the test laser beam having a transmission wavelength to SiC, thereby forming a test separation layer inside the SiC ingot at the predetermined depth, this test separation layer having a test modified portion where SiC is decomposed into Si and C and test cracks extending from the test modified portion along the c-plane in the SiC ingot, in which whether the test cracks have been properly formed is verified. The X direction depicted by the arrow X and the Y direction depicted by the arrow Y are perpendicular to each other and define a substantially horizontal plane as an XY plane.

As depicted in FIG. 1, the SiC wafer manufacturing apparatus 2 includes a base 16 having a substantially horizontal upper surface. The holding unit 4 includes an X movable plate 18 mounted on the base 16 so as to be movable in the X direction, a Y movable plate 20 mounted on the X movable plate 18 so as to be movable in the Y direction, a circular holding table 22 rotatably mounted on the upper surface of the Y movable plate 20, and a holding table motor (not depicted) for rotating the holding table 22.

The laser beam applying unit 6 includes an inverted L-shaped housing 24. The housing 24 is composed of a vertical portion extending vertically upward from the upper surface of the base 16 and a horizontal portion extending substantially horizontally from the upper end of the vertical portion toward a position above the holding unit 4. The laser beam applying unit 6 further includes a laser generating unit (not depicted) incorporated in the housing 24, focusing means 26 mounted on the lower surface of the housing 24 at a front end portion thereof, and focal position adjusting means (not depicted) for adjusting the vertical position of the focal point of the laser beam. The laser generating unit has a laser oscillator (not depicted) for generating a pulsed laser beam and a power controller (not depicted) for controlling the power of the pulsed laser beam generated from the laser oscillator. The focusing means 26 has a focusing lens (not depicted) for focusing the pulsed laser beam generated from the laser oscillator. The focal position adjusting means may be so configured as to have a ball screw connected to the focusing means 26 so as to extend in a vertical direction and a motor for rotating this ball screw, thereby adjusting the vertical position of the focal point of the pulsed laser beam generated from the laser oscillator.

The X moving mechanism 8 has a ball screw 28 extending in the X direction along the upper surface of the base 16 and a motor 30 for rotating the ball screw 28. The ball screw 28 is provided with a nut member (not depicted) connected to the X movable plate 18. Accordingly, when the ball screw 28 is rotated by the motor 30, a rotary motion of the motor 30 is converted into a linear motion by the ball screw 28, and this linear motion is transmitted to the X movable plate 18, so that the X movable plate 18 is moved in the X direction along a pair of guide rails 16a provided on the upper surface of the base 16. Thus, the X movable plate 18 can be relatively fed in the X direction with respect to the laser beam applying unit 6. The X movable plate 18 is slidably mounted on the guide rails 16a extending in the X direction.

The Y moving mechanism 10 has a ball screw 32 extending in the Y direction along the upper surface of the X movable plate 18 and a motor 34 for rotating the ball screw 32. The ball screw 32 is provided with a nut member (not depicted) connected to the Y movable plate 20. Accordingly, when the ball screw 32 is rotated by the motor 34, a rotary motion of the motor 34 is converted to a linear motion by the ball screw 32, and this linear motion is transmitted to the Y movable plate 20, so that the Y movable plate 20 is moved in the Y direction along a pair of guide rails 18a provided on the upper surface of the X movable plate 18. Thus, the Y movable plate 20 can be indexed in the Y direction with respect to the laser beam applying unit 6. The Y movable plate 20 is slidably mounted on the guide rails 18a extending in the Y direction.

The separating unit 12 includes a casing 36 provided near the left ends of the guide rails 16a on the base 16 as viewed in FIG. 1, an arm 38 having a base end vertically movably supported to the casing 36 and extending in the X direction from the base end, and arm elevating means (not depicted) for vertically moving the arm 38. The arm elevating means may be so configured as to have a ball screw connected to the arm 38 so as to extend in the vertical direction and a motor for rotating this ball screw. A motor 40 is connected to the front end of the arm 38, and a suction member 42 is connected to the lower surface of the motor 40 so as to be rotatable about a vertical axis thereof. A plurality of suction holes (not depicted) are formed on the lower surface of the suction member 42. These suction holes of the suction member 42 are connected to suction means (not depicted) for producing a vacuum. Further, the suction member 42 contains ultrasonic vibration applying means (not depicted) for applying ultrasonic vibration to the lower surface of the suction member 42.

The verifying unit 14 includes a light emitting member 44 for applying light to the test separation layer formed in the SiC ingot, a camera 46 for imaging the test separation layer, and a determining portion 48 for determining whether or not the power of the test laser beam is a power at which the test cracks of the test separation layer are properly formed, according to whether or not the brightness of an image obtained by the camera 46 falls within a threshold range. The camera 46 is mounted on the lower surface of the housing 24 at a front end portion thereof so as to be spaced from the focusing means 26 in the X direction. The light emitting member 44 may be configured by an LED lamp. The light emitting member 44 is attached to a lower end portion of the camera 46.

A control unit 50 is electrically connected to the camera 46, and data on the image obtained by the camera 46 is transmitted to the control unit 50. The control unit 50 is configured by a computer. Although not depicted, this computer includes a central processing unit (CPU) for computing according to a control program or the like, a read only memory (ROM) previously storing the control program, a random access memory (RAM) for storing computation results or the like. The determining portion 48 of the verifying unit 14 is previously stored as the control program in the read only memory of the control unit 50. Further, a control portion 52 for controlling the power controller of the laser beam applying unit 6 is also previously stored as the control program in the read only memory of the control unit 50. Also, a monitor 54 for displaying the image obtained by the camera 46 is provided on the upper surface of the housing 24.

In this preferred embodiment, as depicted in FIG. 1, the SiC wafer manufacturing apparatus 2 further includes a grinding unit 56 for grinding the upper surface of the SiC ingot held by the holding unit 4. The grinding unit 56 includes a fixed vertical wall 58 connected to the housing 24, a movable plate 60 vertically movably mounted on the front surface of the fixed vertical wall 58, and elevating means 62 for vertically moving the movable plate 60.

The elevating means 62 has a ball screw 64 extending in the vertical direction along the front surface of the vertical wall 58 and a motor 66 for rotating the ball screw 64. The ball screw 64 is provided with a nut member (not depicted) connected to the movable plate 60. Accordingly, when the ball screw 64 is rotated by the motor 66, a rotary motion of the motor 66 is converted into a linear motion by the ball screw 64, and this linear motion is transmitted to the movable plate 60, so that the movable plate 60 is vertically moved along a pair of guide rails 58a provided on the front surface of the vertical wall 58. That is, the movable plate 60 is slidably mounted on the guide rails 58a extending in the vertical direction perpendicular to both the X direction and the Y direction.

Figure 8:
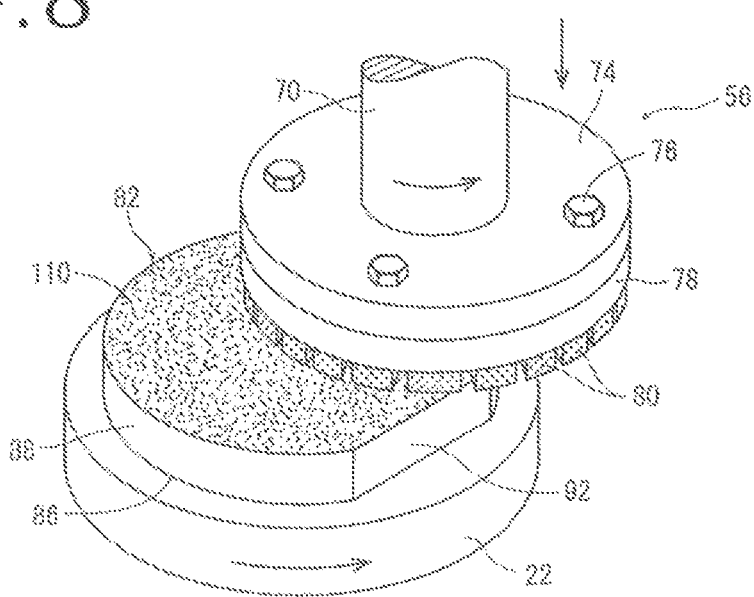
FIG. 8 is a perspective view depicting a flat surface forming step.

A support member 68 is fixed to the front surface of the movable plate 60 so as to project in the Y direction. A spindle 70 is supported to the support member 68 so as to be rotatable about a vertical axis. A spindle motor 72 for rotating the spindle 70 is mounted on the upper surface of the support member 68. Referring to FIGS. 1 and 8, a disk-shaped wheel mount 74 is fixed to the lower end of the spindle 70, and an annular grinding wheel 78 is fixed to the lower surface of the wheel mount 74 by bolts 76. A plurality of abrasive members 80 are fixed to the lower surface of the grinding wheel 78 so as to be annularly arranged at given intervals along the outer circumference of the grinding wheel 78.

Figure 2A:
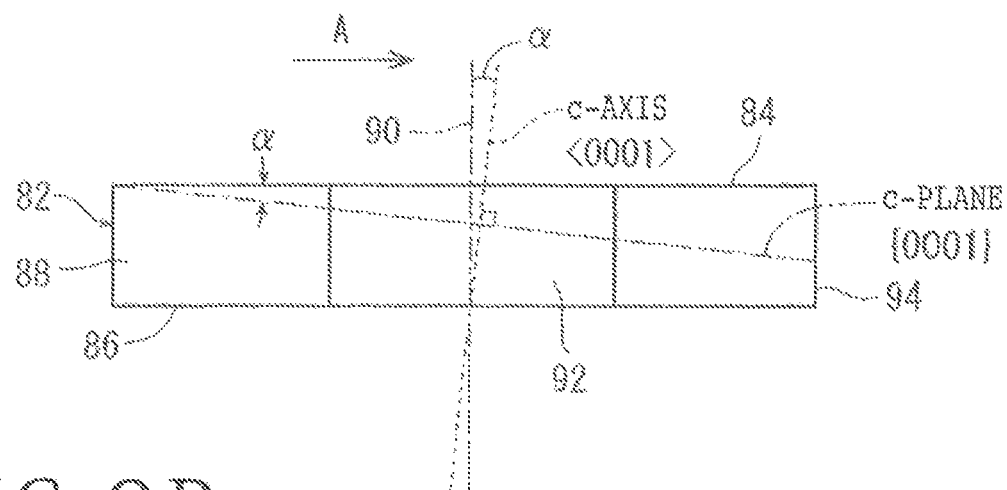
FIG. 2A is an elevational view of an SiC ingot.
Figure 2B:
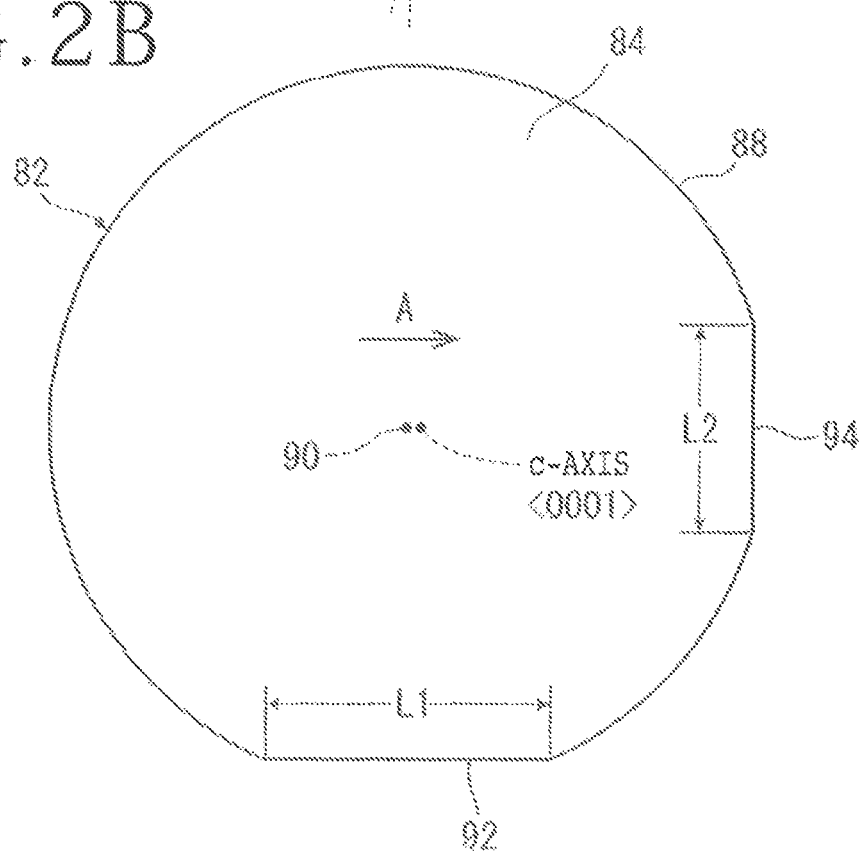
FIG. 2B is a plan view of the SiC ingot depicted in FIG. 2A.

FIGS. 2A and 2B depict an SiC ingot 82 formed of SiC. The SiC ingot 82 has a substantially cylindrical shape. That is, the SiC ingot 82 has a substantially circular first end surface 84, a substantially circular second end surface 86 opposite to the first end surface 84, a substantially cylindrical surface 88 formed so as to connect the first end surface 84 and the second end surface 86, a c-axis (<0001> direction) extending from the first end surface 84 to the second end surface 86, and a c-plane ({0001} plane) perpendicular to the c-axis.

In the SiC ingot 82, the c-axis is inclined by an off angle α (e.g., α=1, 3, or 6 degrees) with respect to a normal 90 to the first end surface 84. The off angle α is formed between the c-plane and the first end surface 84. The direction of formation of the off angle α (i.e., the direction of inclination of the c-axis) is depicted by an arrow A in FIGS. 2A and 2B. Further, the cylindrical surface 88 of the SiC ingot 82 is formed with a first orientation flat 92 and a second orientation flat 94, which are rectangular as viewed in side elevation and function to indicate crystal orientation. As depicted in FIG. 2B, the first orientation flat 92 is parallel to the direction A of formation of the off angle α, and the second orientation flat 94 is perpendicular to the direction A of formation of the off angle α. Further, as depicted in FIG. 2B, the length L2 of the second orientation flat 94 is set shorter than the length L1 of the first orientation flat 92 (L2<L1).

The SiC wafer manufacturing method according to this preferred embodiment will now be described in the case of using the SiC wafer manufacturing apparatus 2 described above. First, the SiC ingot 82 is fixed to the upper surface of the holding table 22 by using a suitable adhesive (e.g., epoxy resin adhesive) in the condition where the second end surface 86 of the SiC ingot 82 is oriented downward. That is, the adhesive is interposed between the second end surface 86 of the SiC ingot 82 and the upper surface of the holding table 22. As a modification, a plurality of suction holes may be formed on the upper surface of the holding table 22, and a suction force may be applied through these suction holes to the upper surface of the holding table 22, thereby holding the SiC ingot 82 on the upper surface of the holding table 22 under suction.

After holding the SiC ingot 82 on the upper surface of the holding table 22, a verifying step is performed in such a manner as to apply a test laser beam to the SiC ingot 82 in a predetermined area in the condition where the focal point of the test laser beam is set inside the SiC ingot 82 at a predetermined depth from an end surface of the SiC ingot 82 (i.e., the first end surface 84 in this preferred embodiment), this predetermined depth corresponding to the thickness of an SiC wafer to be manufactured, the test laser beam having a transmission wavelength to SiC, thereby forming a test separation layer inside the SiC ingot 82 at this predetermined depth, the test separation layer having a test modified portion where SiC is decomposed into Si and C and test cracks extending from the test modified portion along the c-plane in the SiC ingot 82, in which whether or not the test cracks have been properly formed is verified.

Figure 3A:
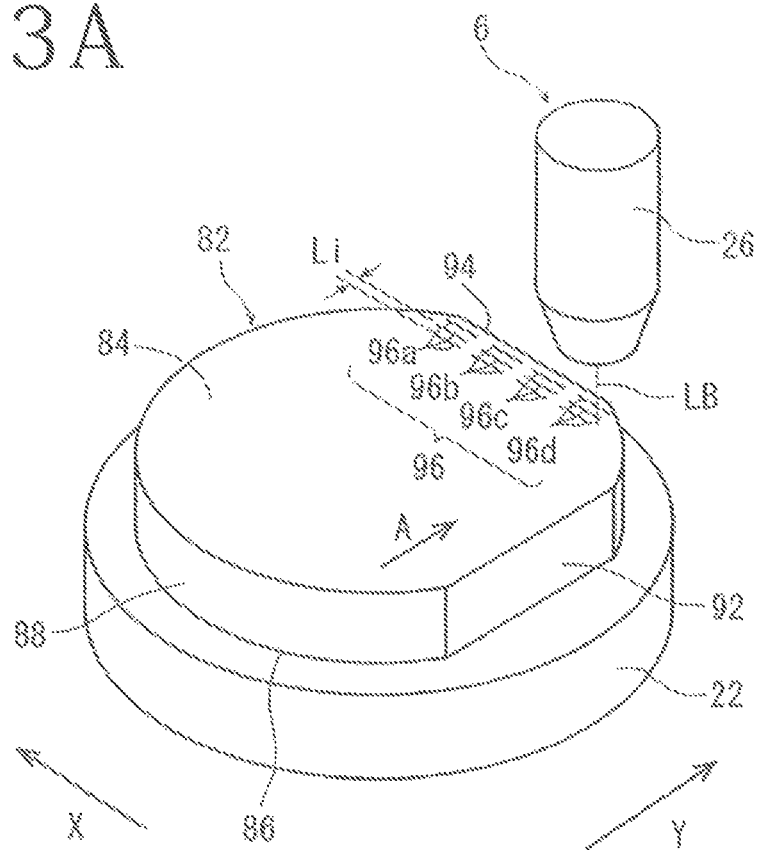
FIG. 3A is a perspective view depicting an operation of applying a test laser beam to the SiC ingot in a verifying step.

In the verifying step, the SiC ingot 82 is first imaged by using the camera 46 positioned above the SiC ingot 82. Thereafter, according to an image of the SiC ingot 82 as obtained by the camera 46, the holding table 22 is moved and rotated by operating the X moving mechanism 8, the Y moving mechanism 10, and the holding table motor, thereby positioning a peripheral area of the SiC ingot 82 (i.e., a peripheral marginal area of the SiC wafer manufactured from the SiC ingot 82, no devices being formed in this peripheral marginal area) directly below the focusing means 26. Further, as depicted in FIG. 3A, the second orientation flat 94 is made parallel to the X direction, so that the direction perpendicular to the direction A of formation of the off angle α is made parallel to the X direction, and the direction A of formation of the off angle α is made parallel to the Y direction.

Figure 3B:
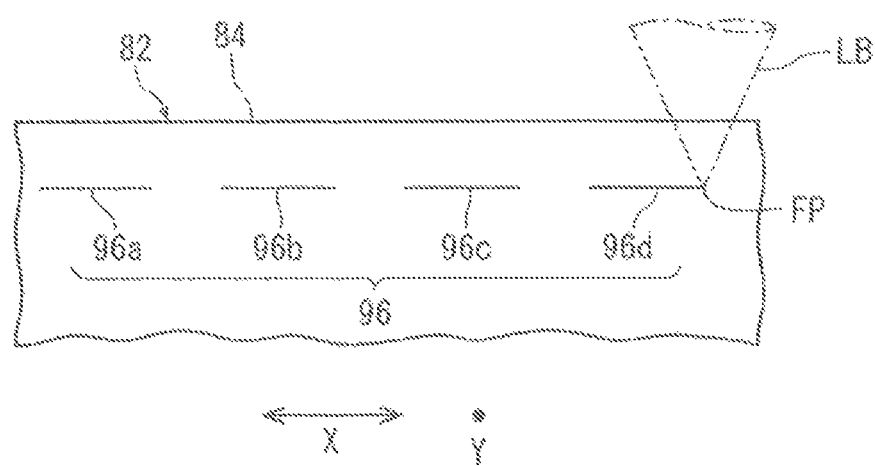
FIG. 3B is an enlarged sectional view depicting the operation depicted in FIG. 3A.

Thereafter, the focusing means 26 is vertically moved by operating the focal position adjusting means to set the focal point FP (see FIG. 3B) of a pulsed laser beam LB at a predetermined depth from the first end surface 84 of the SiC ingot 82, this predetermined depth corresponding to the thickness of an SiC wafer to be manufactured. Thereafter, as depicted in FIGS. 3A and 3B, the pulsed laser beam LB having a transmission wavelength to SiC is applied from the focusing means 26 to the SiC ingot 82 as moving the holding table 22 at a predetermined feed speed in the X direction by operating the X moving mechanism 8, in which the X direction is parallel to the direction perpendicular to the direction A of formation of the off angle α. As a result, a test separation layer 96 for use in the verifying step is formed inside the SiC ingot 82 at the predetermined depth in the peripheral area. The test separation layer 96 is formed in the peripheral area within approximately 2 mm from the peripheral edge of the SiC ingot 82. This peripheral area of the SiC ingot 82 corresponds to the peripheral marginal area of the SiC wafer where no devices are formed. Accordingly, in subsequently forming devices on the SiC wafer manufactured from the SiC ingot 82, there is no possibility that the test separation layer 96 may reduce the quality of the devices.

In forming the test separation layer 96 in the verifying step, the power controller of the laser beam applying unit 6 is controlled by the control portion 52 of the control unit 50, thereby changing the power of the pulsed laser beam LB at suitable time intervals in applying the pulsed laser beam LB to the SiC ingot 82. Accordingly, a plurality of test separation layers 96 are formed under different power conditions of the pulsed laser beam LB. More specifically, in this preferred embodiment, as depicted in FIG. 3B, a test separation layer 96a is formed by setting the power of the pulsed laser beam LB to 4 W, a test separation layer 96b is formed by setting the power of the pulsed laser beam LB to 5 W, a test separation layer 96c is formed by setting the power of the pulsed laser beam LB to 6 W, and a test separation layer 96d is formed by setting the power of the pulsed laser beam LB to 7 W. The power conditions and the number of the plural separation layers 96 may be arbitrarily set.

Thereafter, the Y moving mechanism 10 is operated to move the holding table 22 in the Y direction by a predetermined index amount Li, thereby relatively indexing the SiC ingot 82 with respect to the focal point FP by the predetermined index amount Li in the Y direction parallel to the direction A of formation of the off angle α. Thereafter, the application of the pulsed laser beam LB and the indexing operation are alternately repeated suitable times to thereby form a plurality of test separation layers 96 under different power conditions of the pulsed laser beam LB as depicted in FIG. 3A, in which these test separation layers 96 are arranged along plural parallel lines spaced from each other by the index amount Li in the Y direction, each line extending in the X direction. The test separation layers 96 adjacent to each other in the Y direction parallel to the direction A of formation of the off angle α are formed under the same power conditions.

Figure 4:
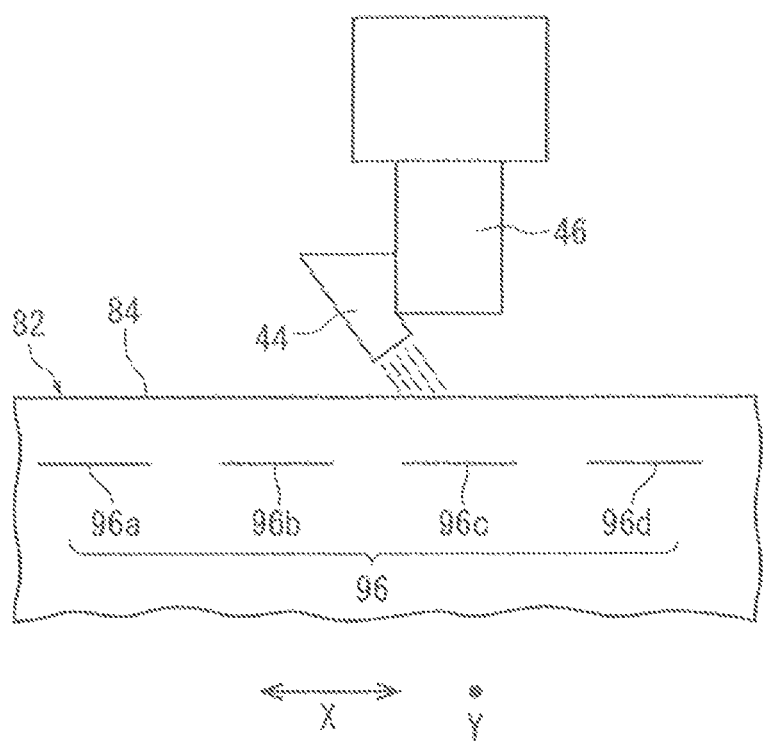
FIG. 4 is an enlarged sectional view, partly in side elevation, depicting an operation of imaging the SiC ingot by using a camera in the verifying step.
Figure 5A:
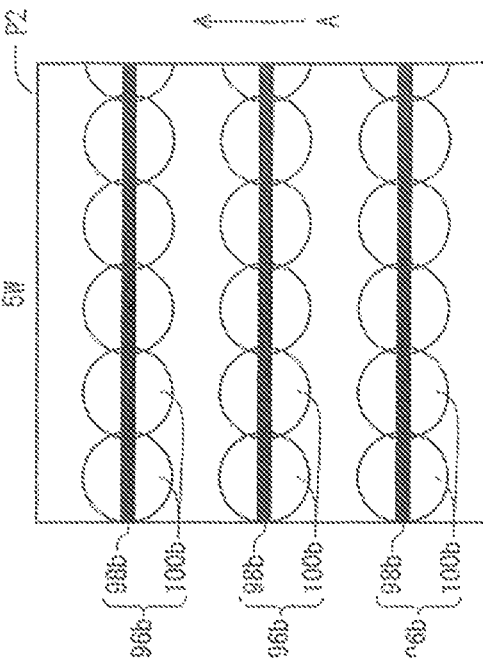
FIGS. 5A to 5D are schematic plan views of images obtained by the camera in the case that the power of the laser beam is changed to form a plurality of different separation layers.
Figure 5B:
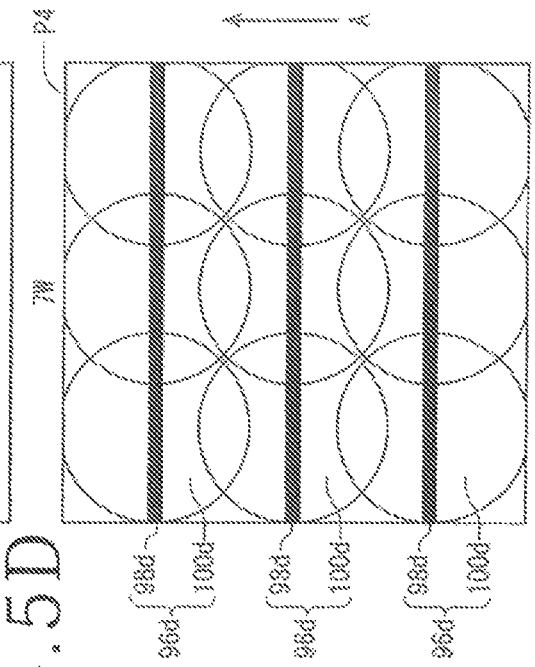
Figure 5C:
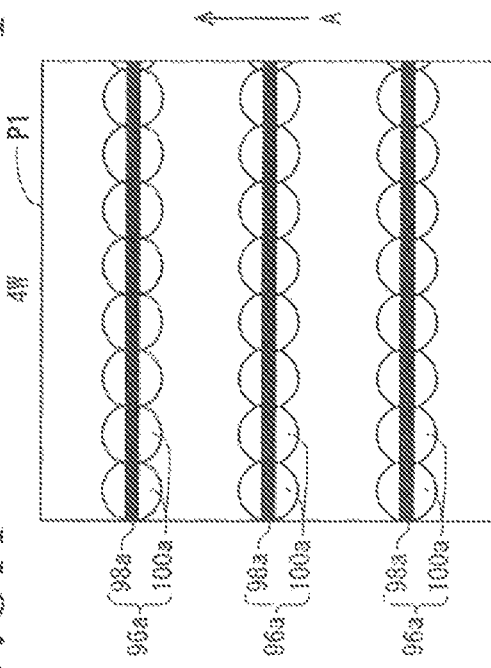
Figure 5D:
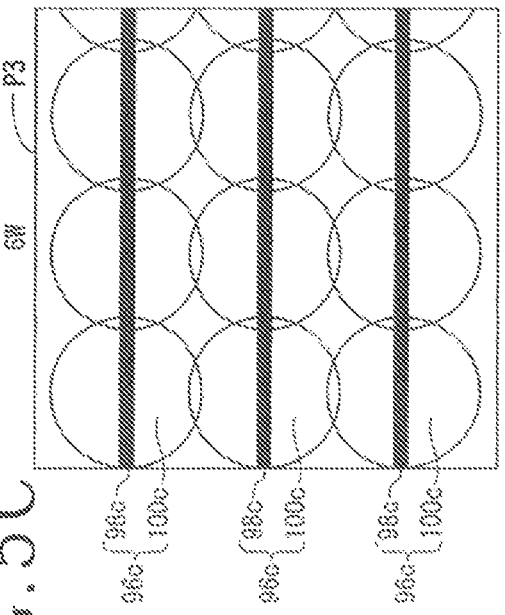

Thereafter, as depicted in FIG. 4, light is applied from the light emitting member 44 to the test separation layers 96a to 96d at an inclined angle with respect to a vertical direction, and the test separation layers 96a to 96d are imaged by the camera 46. FIGS. 5A to 5D depict images P1 to P4 of the test separation layers 96a to 96d, respectively. More specifically, FIG. 5A depicts the image P1 of the plural test separation layers 96a adjacent to each other in the direction A. FIG. 5B depicts the image P2 of the plural test separation layers 96b adjacent to each other in the direction A. FIG. 5C depicts the image P3 of the plural test separation layers 96c adjacent to each other in the direction A. FIG. 5D depicts the image P4 of the plural test separation layers 96d adjacent to each other in the direction A. As depicted in FIG. 5A, each test separation layer 96a is composed of a test modified portion 98a where SiC is decomposed into Si and C and test cracks 100a isotropically extending from the test modified portion 98a along the c-plane. Similarly, as depicted in FIG. 5B, each test separation layer 96b is composed of a test modified portion 98b and test cracks 100b. As depicted in FIG. 5C, each test separation layer 96c is composed of a test modified portion 98c and test cracks 100c. As depicted in FIG. 5D, each test separation layer 96d is composed of a test modified portion 98d and test cracks 100d. More specifically, the pulsed laser beam LB is initially applied to the SiC ingot 82 to thereby decompose SiC into Si and C. Thereafter, the pulsed laser beam LB is next applied to the SiC ingot 82 and absorbed by C previously produced. Thus, SiC is decomposed into Si and C in a chain reaction manner with the movement of the holding table 22 in the X direction to thereby linearly form each modified portion 98a extending in the X direction as depicted in FIG. 5A.

As depicted in FIG. 5A, the test cracks 100a of the test separation layers 96a adjacent to each other in the direction A are not overlapped in the direction A. Similarly, as depicted in FIG. 5B, the test cracks 100b of the test separation layers 96b adjacent to each other in the direction A are not overlapped in the direction A. In contrast, as depicted in FIG. 5C, the test cracks 100c of the test separation layers 96c adjacent to each other in the direction A are overlapped in the direction A. Similarly, as depicted in FIG. 5D, the test cracks 100d of the test separation layers 96d adjacent to each other in the direction A are overlapped in the direction A.

In the case that the cracks of the separation layers adjacent to each other in the direction A are not overlapped in the direction A, it is difficult to separate the SiC wafer from the SiC ingot 82 along the separation layers. In contrast, in the case that the cracks of the separation layers adjacent to each other in the direction A are overlapped in the direction A, the SiC wafer can be easily separated from the SiC ingot 82 along the separation layers. However, if the power of the pulsed laser beam LB is excessive, the cracks may be excessively produced along the c-plane inclined with respect to the first end surface 84 of the SiC ingot 82. As a result, in separating the SiC wafer from the SiC ingot 82 and next grinding a separation surface of the SiC ingot 82 and a separation surface of the SiC wafer to thereby flatten these separation surfaces, the amount of grinding of the SiC ingot 82 and the SiC wafer becomes large, causing an increase in material loss. To cope with this problem, in the verifying step according to this preferred embodiment, the power of the pulsed laser beam LB is set to a minimum power (e.g., 6 W in this preferred embodiment) capable of overlapping the test cracks of the test separation layers adjacent to each other in the direction A as the power at which the cracks of the separation layers to be formed later are properly formed.

As described above, in setting the power of the pulsed laser beam LB in the verifying step, the range of the test cracks 100a of each test separation layer 96a in the direction A may be checked from the image P1. Similarly, the range of the test cracks 100b of each test separation layer 96b in the direction A may be checked from the image P2, the range of the test cracks 100c of each test separation layer 96c in the direction A may be checked from the image P3, and the range of the test cracks 100d of each test separation layer 96d in the direction A may be checked from the image P4. However, in this preferred embodiment, the determining portion 48 of the verifying unit 14 can determine whether or not the power of the pulsed laser beam LB is a power at which the test cracks are properly formed, according to whether or not the brightness of each of the images P1 to P4 obtained by the camera 46 falls within a threshold range.

The determining portion 48 receives data on the images P1 to P4 obtained by the camera 46. Thereafter, the determining portion 48 performs binarization processing for the images P1 to P4. When the images P1 to P4 are subjected to binarization processing, the area where the test cracks 100a to 100d are formed mainly becomes white, whereas the area where the test cracks 100a to 100d are not formed and the modified portions 98a to 98d where SiC is decomposed into Si and C mainly become black. Thus, the determining portion 48 produces a binary image from each of the images P1 to P4. When the ratio between the black area and the white area in each binary image falls within a predetermined range (e.g., the proportion of the black area falls within a range of 30% to 40% and the proportion of the white area falls within a range of 60% to 70%, that is, the ratio between the black area and the white area falls within a range of 3:7 to 4:6), the determining portion 48 determines that the test cracks have been properly formed and that the power of the pulsed laser beam LB in this case is a proper power at which the test cracks are properly formed.

The area to be subjected to the binarization processing in the image obtained by the camera 46 may be set in the following manner in the case of FIG. 5A, for example. In the direction A of formation of the off angle α, the area from the uppermost modified portion 98a to the lowermost modified portion 98a may be set, whereas in the direction perpendicular to the direction A of formation of the off angle α, an arbitrary area including the test separation layers formed under the same power conditions may be set. Further, the ratio between the black area and the white area in the binary image may be previously determined by an experiment in the case of forming the separation layer by setting the power at which the cracks are properly formed.

After performing the verifying step, a separation layer forming step is performed in such a manner that the pulsed laser beam LB having a transmission wavelength to SiC is applied to the SiC ingot 82 in the condition where the focal point FP of the pulsed laser beam LB is set inside the SiC ingot 82 at a predetermined depth from the upper surface of the SiC ingot 82 (e.g., the first end surface 84 in this preferred embodiment), this predetermined depth corresponding to the thickness of the SiC wafer to be manufactured, thereby forming a separation layer inside the SiC ingot 82 at this predetermined depth, the separation layer being composed of a modified portion where SiC is decomposed into Si and C and cracks extending from this modified portion along the c-plane in the SiC ingot 82. The power of the pulsed laser beam LB in the separation layer forming step is the same as the power (e.g., 6 W in this preferred embodiment) set in the verifying step.

In the separation layer forming step, a positional relation between the SiC ingot 82 and the focusing means 26 in an XY plane is first adjusted according to the image of the SiC ingot 82 as obtained by the camera 46 in the verifying step. The orientation of the SiC ingot 82 is set similar to that set in the verifying step. That is, the direction perpendicular to the direction A of formation of the off angle α is made parallel to the X direction, and the direction A of formation of the off angle α is made parallel to the Y direction (see FIG. 6A).

Figure 6A:
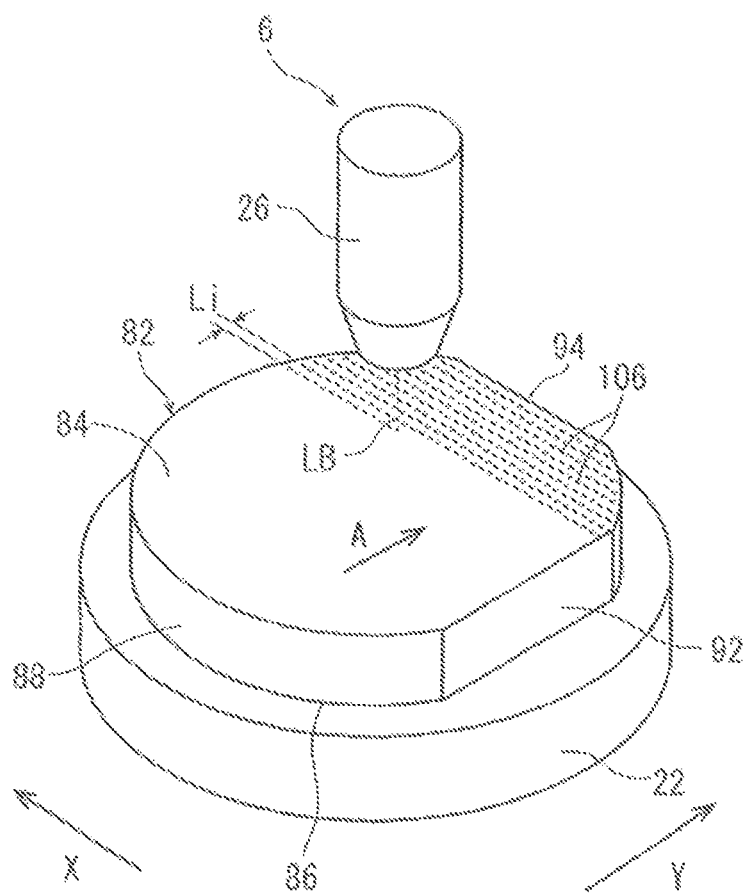
FIG. 6A is a perspective view depicting a separation layer forming step.

Thereafter, the focal point FP of the pulsed laser beam LB is set inside the SiC ingot 82 at a predetermined depth from the first end surface 84 of the SiC ingot 82, this predetermined depth corresponding to the thickness of the SiC wafer to be manufactured. Thereafter, as depicted in FIG. 6A, the pulsed laser beam LB having a transmission wavelength to SiC is applied from the focusing means 26 to the SiC ingot 82 as moving the holding table 22 in the X direction at a predetermined feed speed by operating the X moving mechanism 8, in which the X direction is parallel to the direction perpendicular to the direction A of formation of the off angle α. As a result, a belt-shaped separation layer 106 is formed inside the SiC ingot 82 at the predetermined depth so as to extend in the X direction. The separation layer 106 is composed of a modified portion 102 where SiC is decomposed into Si and C and cracks 104 isotropically extending from the modified portion 102 along the c-plane. More specifically, the pulsed laser beam LB is initially applied to the SiC ingot 82 to thereby decompose SiC into Si and C. Thereafter, the pulsed laser beam LB is next applied to the SiC ingot 82 and absorbed by C previously produced. Thus, SiC is decomposed into Si and C in a chain reaction manner with the movement of the holding table 22 in the X direction to thereby linearly form the modified portion 102 extending in the X direction.

Thereafter, the Y moving mechanism 10 is operated to move the holding table 22 in the Y direction by a predetermined index amount Li, thereby indexing the SiC ingot 82 with respect to the focal point FP by the predetermined index amount Li in the Y direction parallel to the direction A of formation of the off angle α. Thereafter, the application of the pulsed laser beam LB and the indexing operation are alternately repeated to thereby form a plurality of modified portions 102 spaced from each other by the index amount Li in the direction A of formation of the off angle α, in which each modified portion 102 continuously extends in the direction perpendicular to the direction A of formation of the off angle α. Further, cracks 104 extend isotropically from each modified portion 102 along the c-plane. The index amount Li in the separation layer forming step is the same as the index amount Li in the verifying step.

Figure 6B:
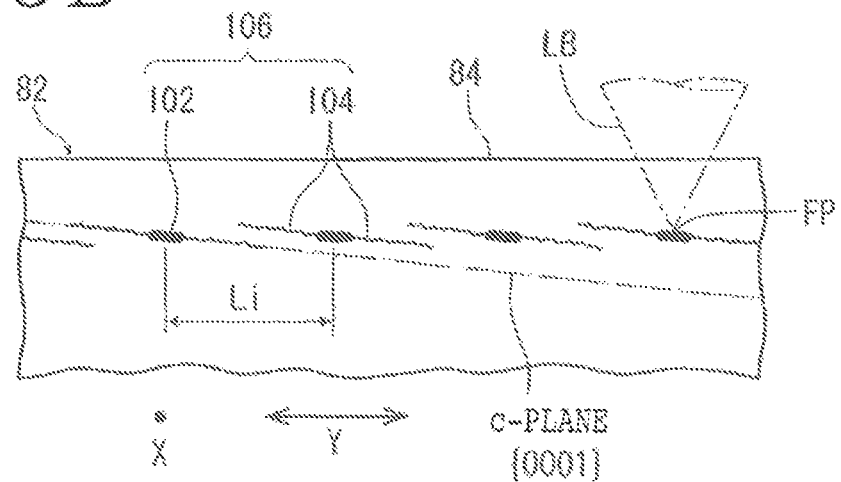
FIG. 6B is an enlarged sectional view depicting the separation layer forming step depicted in FIG. 6A.

In this preferred embodiment, the verifying step is performed before performing the separation layer forming step, thereby setting the power of the pulsed laser beam LB to a power at which the cracks 104 are properly formed. Accordingly, the cracks 104 of the separation layers 106 adjacent to each other in the direction A of formation of the off angle α are overlapped in the direction A (the Y direction) as depicted in FIG. 6B. In this manner, the separation layer forming step is performed to form the plural separation layers 106 inside the SiC ingot 82 at a predetermined depth (in a cutting plane) from the first end surface 84 of the SiC ingot 82, this predetermined depth corresponding to the thickness of the SiC wafer to be manufactured, in which each separation layer 106 is composed of the modified portion 102 and the cracks 104, and each separation layer 106 has a reduced strength allowing the separation of the SiC wafer from the SiC ingot 82. The plural separation layers 106 are formed inside the SiC ingot 82 at the same depth to form a planar separation layer.

Figure 7:
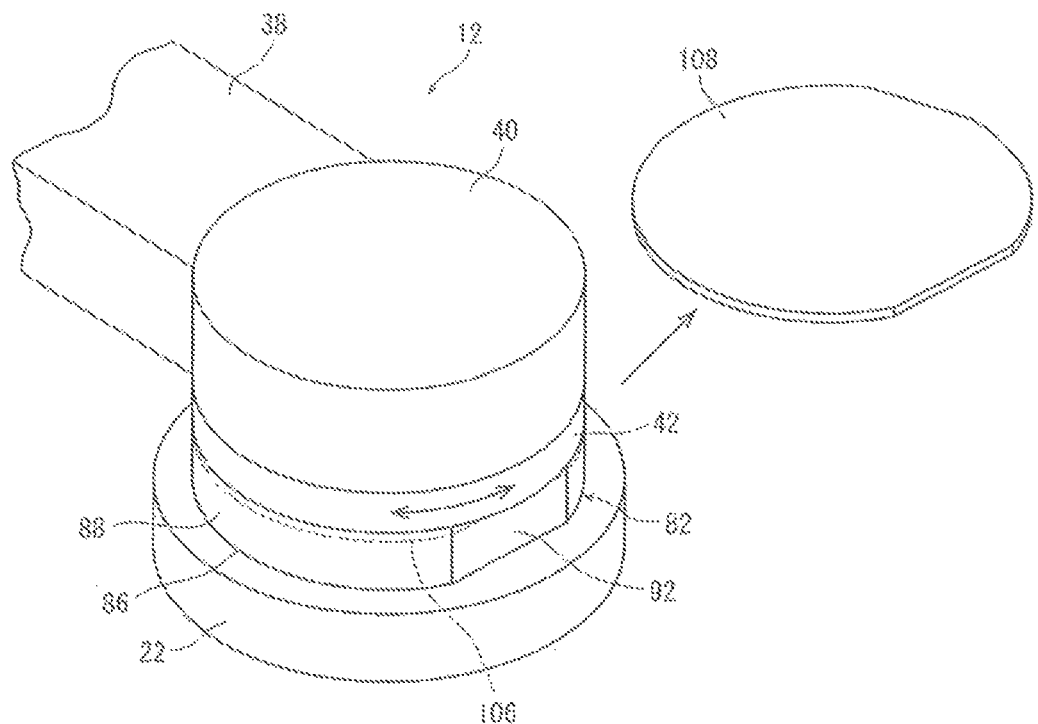
FIG. 7 is a perspective view depicting a separating step.

After performing the separation layer forming step, a separating step is performed to separate the SiC wafer from the SiC ingot 82 along the planar separation layer composed of the plural separation layers 106. In the separating step, the X moving mechanism 8 is operated to move the holding table 22 to the position directly below the suction member 42 of the separating unit 12. Thereafter, the arm elevating means in the separating unit 12 is operated to lower the arm 38 until the lower surface of the suction member 42 comes into close contact with the first end surface 84 of the SiC ingot 82 held on the upper surface of the holding table 22 as depicted in FIG. 7. Thereafter, the suction means is operated to hold the first end surface 84 of the SiC ingot 82 on the lower surface of the suction member 42 under suction. Thereafter, the ultrasonic vibration applying means in the separating unit 12 is operated to apply ultrasonic vibration to the lower surface of the suction member 42, and at the same time, the motor 40 is operated to rotate the suction member 42. Accordingly, an external force is applied to the planar separation layer composed of the plural separation layers 106, so that an SiC wafer 108 can be separated from the SiC ingot 82 along the planar separation layer composed of the plural separation layers 106 as depicted in FIG. 7.

After performing the separating step, a flat surface forming step is performed to grind the upper surface of the SiC ingot 82 (separation surface 110 depicted in FIG. 8), thereby flattening the separation surface 110 of the SiC ingot 82. In the flat surface forming step, the X moving mechanism 8 is first operated to move the holding table 22 to the position below the grinding wheel 78 (the abrasive members 80) of the grinding unit 56. Thereafter, as depicted in FIG. 8, the holding table 22 is rotated by the holding table motor at a predetermined speed (e.g., 300 rpm) in a counterclockwise direction as viewed in plan. Similarly, the spindle 70 is rotated by the spindle motor 72 at a predetermined speed (e.g., 6000 rpm) in a counterclockwise direction as viewed in plan. Thereafter, the spindle 70 is lowered by the elevating means 62 until the abrasive members 80 come into contact with the separation surface 110 of the SiC ingot 82. Thereafter, the spindle 70 is further lowered at a predetermined feed speed (e.g., 0.1 μm/s). Accordingly, the separation surface 110 of the SiC ingot 82 is ground by the abrasive members 80 to form a flat surface having flatness to such a level that the incidence of the pulsed laser beam LB is not hindered in a subsequent step.

After performing the flat surface forming step, all of the verifying step, the separation layer forming step, the separating step, and the flat surface forming step are repeated to thereby manufacture a plurality of SiC wafers 108 from the SiC ingot 82. Preferably, the verifying step is performed every time the separating layer is performed. That is, the verifying step is preferably performed after performing the separating step and before next performing the separating step. However, after first performing the verifying step and the separating step, the number of times the verifying step is repeated may be set smaller than the number of times the separating step is repeated. For example, the verifying step may be performed once every time the separating step is repeated five times.

According to the above preferred embodiment, the verifying step is performed to set the power of the pulsed laser beam LB to a power at which the cracks 104 are properly formed in each separation layer 106 after verifying the result of changing of the power of the pulsed laser beam LB. Accordingly, even when the height of the SiC ingot 82 is decreased by the repetition of the separation of the SiC wafer 108, causing a change in crystal structure in the cutting plane or even when the SiC ingot 82 to be processed is changed to cause a change in crystal structure in the cutting plane, each separation layer 106 can be properly formed along the cutting plane.

The verifying step and the separation layer forming step may be performed under the following processing conditions, for example. The width of the modified portion and the range of the cracks (i.e., the length of each crack extending from the modified portion) mentioned above are those in the direction A of formation of the off angle α.

Wavelength of the pulsed laser beam: 1064 nm
Repetition frequency: 120 kHz
Average power: 4 to 10 W
Pulse width: 4 ns
Numerical aperture (NA) of the focusing lens: 0.65
Feed speed: 900 mm/s
Index amount: 400 to 500 μm
Width of the modified portion: 10 μm
Range of the cracks: 250 μm The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A SiC wafer manufacturing method for manufacturing a SiC wafer from a SiC ingot having an end surface, the SiC wafer manufacturing method comprising the steps of:
    verifying a condition of test cracks comprising applying a test laser beam to the SiC ingot in a predetermined area in a condition where the focal point of the test laser beam is set inside the SiC ingot at a predetermined depth from the end surface of the SiC ingot, the predetermined depth corresponding to the thickness of the SiC wafer to be manufactured, the test laser beam having a transmission wavelength transmissible through SiC, thereby forming a test separation layer inside the SiC ingot at the predetermined depth, the test separation layer having a first test modified portion at the predetermined depth where SiC is separated into Si and C and first test cracks extending from the first test modified portion along a c-plane in the SiC ingot;
    providing relative movement between the SiC ingot and the test laser beam in a direction perpendicular to a length of the first test modified portion and forming a second test modified portion parallel to the first test modified portion and aligned therewith, thereby forming the second test modified portion inside the SiC ingot at the predetermined depth, the second test modified portion where SiC is separated into Si and C, wherein second test cracks from the second test modified portion along a c-plane in the SiC ingot;
    forming a separation layer by applying a laser beam to the SiC ingot in a condition where the focal point of the laser beam is set inside the SiC ingot at the predetermined depth from the end surface of the SiC ingot after performing the verifying step, the predetermined depth corresponding to the thickness of the SiC wafer to be manufactured, the laser beam having a transmission wavelength transmissible through SiC, thereby forming the separation layer inside the SiC ingot at the predetermined depth, the separation layer inside the SiC ingot having a modified portion where SiC is separated into Si and C and cracks extending from the modified portion along the c-plane in the SiC ingot; and
    separating the SiC wafer from the SiC ingot along the separation layer after performing the separation layer forming step,
    the verifying step including setting the power of the test laser beam to a power at which the first and second test cracks are formed, such that the first and second test cracks overlap in the direction perpendicular to the length of the first test modified portion and in which the verifying step confirms whether or not the first and second test cracks have been formed, such that the first and second test cracks overlap in the direction perpendicular to the length of the first test modified layer.

2. The SiC wafer manufacturing method according to claim 1,
    wherein the verifying step is performed again after initially performing the separating step and before next performing the separating step.

3. A SiC wafer manufacturing apparatus for manufacturing a SiC wafer from a SiC ingot having an end surface, the SiC wafer manufacturing apparatus comprising:
    a laser beam, wherein the laser beam is applied to the SiC ingot in a condition where the focal point of the laser beam is set inside the SiC ingot at a predetermined depth from the end surface of the SiC ingot, the predetermined depth corresponding to the thickness of the SiC wafer to be manufactured, the laser beam having a transmission wavelength transmissible through SiC, thereby forming a separation layer inside the SiC ingot at the predetermined depth, the separation layer having a modified portion where SiC is separated into Si and C and cracks extending from the modified portion along a c-plane in the SiC ingot;
    a separator, wherein the separator separates the SiC wafer from the SiC ingot along the separation layer;
    a test laser beam, wherein the test laser beam is applied to the SiC ingot in a predetermined area in a condition where the focal point of the test laser beam is set inside the SiC ingot at the predetermined depth from the end surface of the SiC ingot, the predetermined depth corresponding to the thickness of the SiC wafer to be manufactured, the test laser beam having a transmission wavelength transmissible through SiC, thereby forming a test separation layer inside the SiC ingot at the predetermined depth, the test separation layer having a first test modified portion where SiC is separated into Si and C and first test cracks extending from the first test modified portion along the c-plane in the SiC ingot; and a controller which controls a relative movement between the SiC ingot and the test laser beam in a direction perpendicular to a length of the first test modified portion, wherein the test laser beam forms a second test modified portion parallel to the first test modified portion and aligned therewith, thereby forming the second test modified portion inside the SiC ingot at the predetermined depth, the second test modified portion where SiC is separated into Si and C, wherein second test cracks extend from the second test modified portion along a c-plane in the SiC ingot;

wherein a verifying unit performs verification by changing a power of the test laser beam and setting the power of the test laser beam to a power at which the first and second test cracks are formed, such that the first and second test cracks overlap in the direction perpendicular to the length of the first test modified portion.

4. The SiC wafer manufacturing apparatus according to claim 3, further comprising:

a light applied to the test separation layer formed in the SiC ingot, a camera for imaging the test separation layer, wherein the controller includes a control program which determines whether or not the power of the test laser beam is a power at which the first and second test cracks of the first and second test modified portions are formed such that the first and second test cracks overlap in the direction perpendicular to the length of the first test modified portion, according to whether or not the brightness of an image obtained by the camera falls within a threshold range.

5. The SiC wafer manufacturing apparatus according to claim 4, wherein the controller performs binarization processing for the image to obtain a binary image and then determines whether or not the ratio between a black area and a white area in the binary image falls within a predetermined range, in which, when the ratio between the black area and the white area falls within the predetermined range, the controller determines that the power of the test laser beam is a power at which the first and second test cracks are formed such that the first and second test cracks overlap in the direction perpendicular to the length of the first test modified portion.

6. The SiC wafer manufacturing method according to claim 1, wherein the c-plane of the first test modified portion and the c-plane of the second test modified portion are parallel.

7. The SiC wafer manufacturing method according to claim 6, wherein the c-plane of the first test modified portion and the c-plane of the second test modified portion are angled in relation to the end surface of the SiC ingot.

8. The SiC wafer manufacturing method according to claim 7, wherein the c-planes of the first and second test modified portions are each perpendicular to a corresponding c-axis, each c-axis is inclined by an off angle greater than zero to a normal to the end surface of the SiC ingot.

9. The SiC wafer manufacturing method according to claim 3, wherein the c-plane of the first test modified portion and the c-plane of the second test modified portion are parallel.

10. The SiC wafer manufacturing method according to claim 9, wherein the c-plane of the first test modified portion and the c-plane of the second test modified portion are angled in relation to the end surface of the SiC ingot.

11. The SiC wafer manufacturing method according to claim 10, wherein the c-planes of the first and second test modified portions are each perpendicular to a corresponding c-axis, each c-axis is inclined by an off angle greater than zero to a normal to the end surface of the SiC ingot.

12. A SiC wafer manufacturing method for manufacturing a SiC wafer from a SiC ingot having an end surface, the SiC wafer manufacturing method comprising:

applying a test laser beam to the SiC ingot in a predetermined area in a condition where the focal point of the test laser beam is set inside the SiC ingot at a predetermined depth from the end surface of the SiC ingot, the predetermined depth corresponding to the thickness of the SiC wafer to be manufactured, the test laser beam having a transmission wavelength transmissible through SiC, the verifying step comprising:

setting the test laser beam to a first power;

forming a first test separation layer inside the SiC ingot at the predetermined depth, the first test separation layer having a first test modified portion at the predetermined depth where SiC is separated into Si and C and first test cracks extending from the first test modified portion along a c-plane in the SiC ingot;

forming a second test separation layer by providing relative movement between the SiC ingot and the test laser beam in a direction perpendicular to a length of the first test modified portion and forming a second test modified portion parallel to the first test modified portion and aligned therewith, wherein the second test modified portion is located at the predetermined depth where SiC is separated into Si and C, wherein second test cracks extend from the second test modified portion along a c-plane in the SiC ingot;

confirming whether the first and second test cracks have been formed such that the first and second test cracks overlap in the direction perpendicular to the length of the first test modified layer; and with the test laser beam set at a second power, repeating, as necessary, the forming the first test separation layer step, the forming the second test separation layer step, and the confirming step after providing further relative movement between the SiC ingot and the test laser beam in a direction parallel to the length of the first test modified portion until the first and second test cracks have been formed such that the first and second test cracks overlap in the direction perpendicular to the length of the first test modified layer;

the SiC wafer manufacturing method further comprising:
applying a laser beam to the SiC ingot in a condition where the focal point of the laser beam is set inside the SiC ingot at the predetermined depth from the end surface of the SiC ingot after performing the verifying step, the predetermined depth corresponding to the thickness of the SiC wafer to be manufactured, the laser beam having a transmission wavelength transmissible through SiC, thereby forming the separation layer inside the SiC ingot at the predetermined depth, the separation layer inside the SiC ingot having a modified portion where SiC is separated into Si and C and cracks extending from the modified portion along the c-plane in the SiC ingot; and separating the SiC wafer from the SiC ingot along the separation layer after performing the separation layer forming step.

\* \* \* \* \*